US010615136B2

(12) United States Patent
Cho et al.

(10) Patent No.: US 10,615,136 B2
(45) Date of Patent: Apr. 7, 2020

(54) MICRO-DEVICE PANEL AND MANUFACTURING PROCESS THEREOF

(71) Applicant: Novatek Microelectronics Corp., Hsinchu (TW)

(72) Inventors: Sheng-Tien Cho, Hsinchu (TW); Hua-Gang Chang, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/412,430

(22) Filed: May 15, 2019

(65) Prior Publication Data

US 2019/0267340 A1  Aug. 29, 2019

Related U.S. Application Data

(62) Division of application No. 15/439,961, filed on Feb. 23, 2017.

(51) Int. Cl.
| | |
|---|---|
| *H01L 27/15* | (2006.01) |
| *H01L 33/00* | (2010.01) |
| *H01L 25/16* | (2006.01) |
| *H01L 23/00* | (2006.01) |
| *G09G 3/00* | (2006.01) |
| *H01L 21/66* | (2006.01) |
| *H01L 25/075* | (2006.01) |

(52) U.S. Cl.
CPC ............ *H01L 24/00* (2013.01); *G09G 3/006* (2013.01); *H01L 22/20* (2013.01); *H01L 22/34* (2013.01); *H01L 24/75* (2013.01); *H01L 24/95* (2013.01); *H01L 25/167* (2013.01); *H01L 27/156* (2013.01); *H01L 33/005* (2013.01); *H01L 22/14* (2013.01); *H01L 25/0753* (2013.01); *H01L 2224/7598* (2013.01); *H01L 2224/75305* (2013.01); *H01L 2224/81* (2013.01); *H01L 2924/12041* (2013.01); *H01L 2924/12044* (2013.01)

(58) Field of Classification Search
CPC ..... H01L 33/005; H01L 22/34; H01L 25/167; H01L 27/156
USPC ..................................................... 257/88, 89
See application file for complete search history.

(56) References Cited

U.S. PATENT DOCUMENTS

| | | | |
|---|---|---|---|
| 9,252,375 B2* | 2/2016 | Bibl | H01L 51/50 |
| 2014/0048828 A1* | 2/2014 | Yang | H01L 33/08 |
| | | | 257/89 |
| 2014/0186979 A1* | 7/2014 | Tu | H01L 33/52 |
| | | | 438/27 |

(Continued)

*Primary Examiner* — Matthew E Warren
(74) *Attorney, Agent, or Firm* — JCIPRNET

(57) ABSTRACT

A manufacturing process for a micro-device panel including the following steps is provided. A plurality of micro-device sets are formed on a transferring substrate, and each of the plurality of micro-device sets has at least one micro-device. A plurality of receiving blocks are provided. The plurality of micro-device sets are respectively transferred from the transferring substrate onto the plurality of receiving blocks to form a plurality of building blocks by a transfer head. The plurality of building blocks are placed on a receiving substrate. Finally, the adjacent building blocks on the receiving substrate are connected by a plurality of connecting devices to form the micro-device panel.

10 Claims, 20 Drawing Sheets

(56) References Cited

U.S. PATENT DOCUMENTS

| | | | |
|---|---|---|---|
| 2015/0333221 A1* | 11/2015 | Bibl | G09F 9/301 257/88 |
| 2016/0104696 A1* | 4/2016 | LaVeigne | H01L 25/167 257/88 |
| 2018/0198020 A1* | 7/2018 | Lai | H01L 33/06 |

* cited by examiner

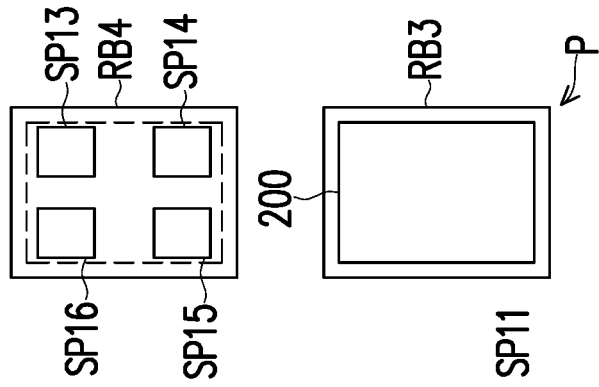
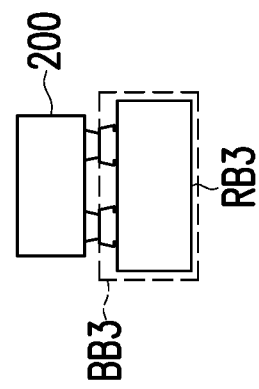
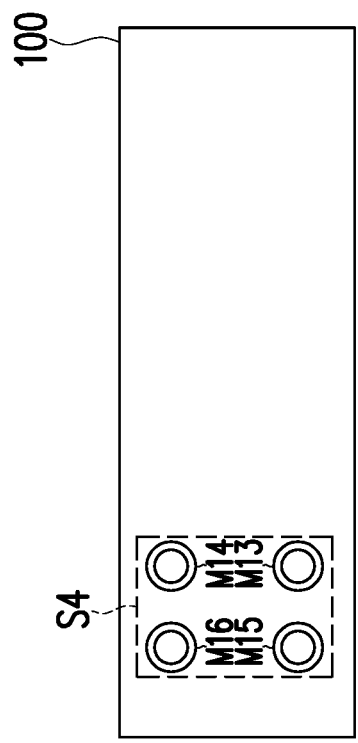
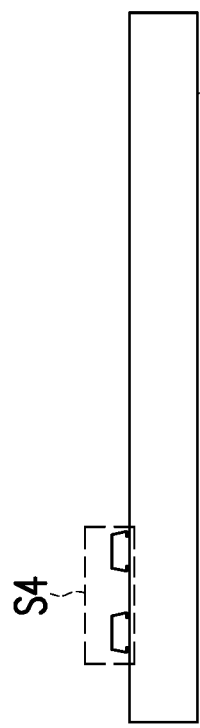
FIG. 2J
FIG. 3J

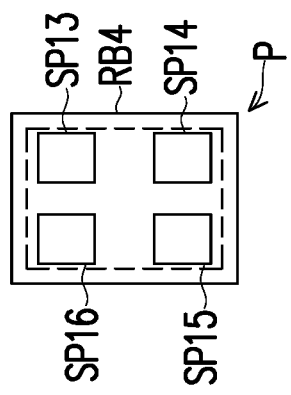
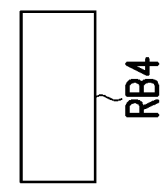
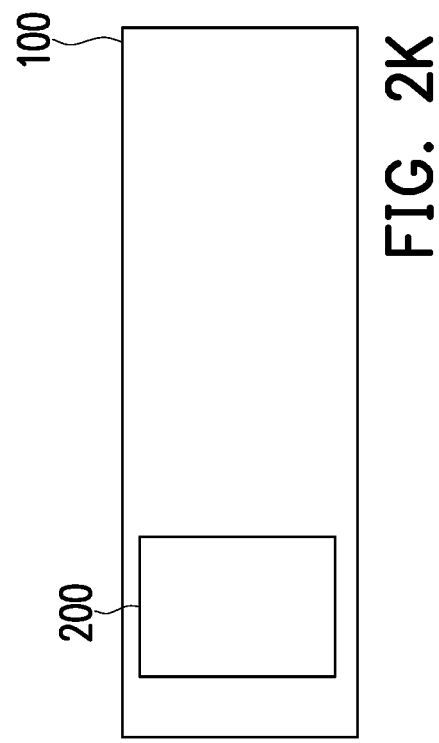
FIG. 2K
FIG. 3K

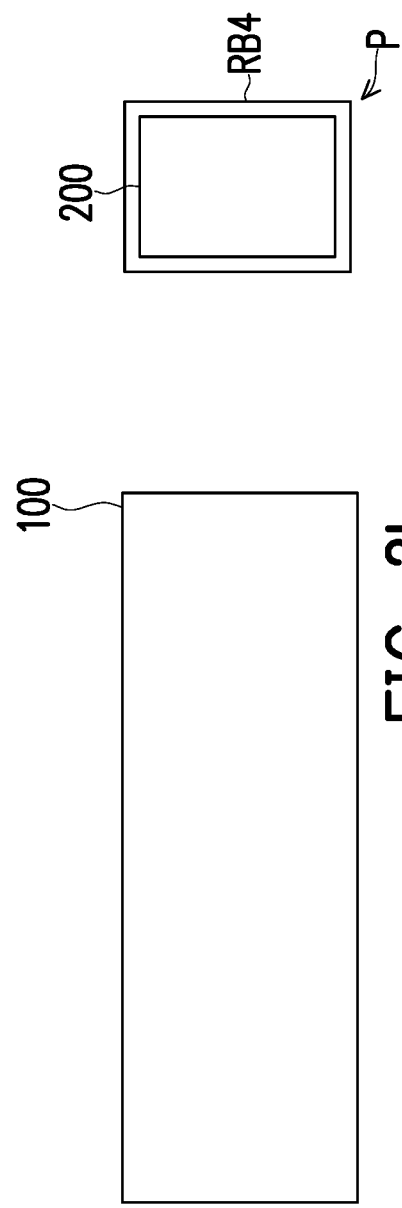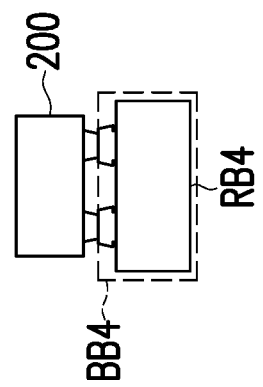
FIG. 2L
FIG. 3L

MICRO-DEVICE PANEL AND MANUFACTURING PROCESS THEREOF

CROSS-REFERENCE TO RELATED APPLICATION

This application is a divisional application of and claims the priority benefit of a prior application Ser. No. 15/439,961, filed on Feb. 23, 2017. The entirety of the above-mentioned patent application is hereby incorporated by reference herein and made a part of this specification.

BACKGROUND OF THE INVENTION

1. Field of the Invention

The invention relates to a micro-device panel and a manufacturing process thereof, in particular, to a micro-device panel and a manufacturing process thereof which has advantages of short manufacturing time and high yield rate.

2. Description of Related Art

Due to the demand of a thinner, lighter, brighter, and low power display on the market, micro light emitting diode (micro-LED) display has been considering as a potential way to replace liquid-crystal display (LCD) and organic light-emitting diode (OLED) since micro-LED can bring significant improvements in brightness, color contrast, and energy efficiency compared to LCD and even OLED.

However, micro-LEDs are not yet in mass production and the transfer technology is not fully matured. Particularly, in manufacturing a 5 inches Full HD panel including 1080×1920 pixels or 1080×1920×3 subpixels, the micro-LEDs are formed on a transferring substrate and then are transferred by a transfer head onto the active area of the 5 inches Full HD panel. As shown in FIG. 1, a transferring unit 10 including, for example, 100×100 mLEDs is transferred to the active area 20 of the 5 inches Full HD panel, and the size of the active area 20 is much greater than the size of the transferring unit 10. Hence, when transferring one transferring unit 10, most of the time is wasted on moving and aligning the transferring unit 10, and time for placing the transferring unit 10 onto the active area 20 is only about 3-4 seconds. In order to manufacturing the 5 inches Full HD panel, around 660 transferring units need transferring. As a result, the manufacturing process takes a long period.

Otherwise, since 100×100 mLEDs of the transferring unit 10 are placed onto the active area 20 at once, there are high probability of failure. Therefore, the yield rate cannot achieve 100 percent. If the entire 5 inches Full HD panel is detected to have defect which cannot be repaired, that entire 5 inches Full HD panel must be discarded.

SUMMARY OF THE INVENTION

Accordingly, the invention is directed to a micro-device panel and a manufacturing process thereof which has advantages of short manufacturing time and high yield rate.

The invention provides a manufacturing process of a micro-device panel including the following steps. A plurality of micro-device sets are formed on a transferring substrate, and each of the plurality of micro-device sets has at least one micro-device. A plurality of receiving blocks are provided. The plurality of micro-device sets are respectively transferred from the transferring substrate onto the plurality of receiving blocks to form a plurality of building blocks by a transfer head. The plurality of building blocks are placed on a receiving substrate. Finally, the adjacent building blocks on the receiving substrate are connected by a plurality of connecting devices to form the micro-device panel.

In one embodiment of the invention, the plurality of micro-device sets are in one-to-one correspondence with the plurality of receiving blocks, and the step of respectively transferring the plurality of micro-device sets from the transferring substrate onto the plurality of receiving blocks to form the plurality of building blocks by the transfer head further includes the following steps. Each of the plurality of micro-device sets is repeatedly transferred from the transferring substrate onto a corresponding receiving block in the plurality of receiving blocks to form one of the building blocks. Each of the building blocks is tested, so as to determine a plurality of functional building blocks.

In one embodiment of the invention, the at least one micro-device of each of the plurality of micro-device sets forms a micro-device array, each of the receiving blocks includes an active area having at least one sub-pixel, and the step of repeatedly transferring each of the plurality of micro-device sets from the transferring substrate onto the corresponding receiving block in the plurality of receiving blocks to form one of the building blocks further includes the following steps. One of the plurality of micro-device sets is picked up from the transferring substrate. The one of the plurality of micro-device sets is moved and aligned with one of the receiving blocks corresponding to the one of the plurality of micro-device sets. The one of the plurality of micro-device sets is placed onto the one of the receiving blocks, so that the micro-device array is corresponding to the active area and the at least one micro-device is disposed corresponding to the at least one sub-pixel.

In one embodiment of the invention, the number of the at least one micro-device in the micro-device array of each of the plurality of micro-device sets is equal to the number of the at least one sub-pixel in the active area of the corresponding receiving block in the plurality of receiving blocks.

In one embodiment of the invention, the step of placing the plurality of building blocks on the receiving substrate further includes the following step: the plurality of functional building blocks are placed on the same plane of the receiving substrate.

In one embodiment of the invention, the step of placing the plurality of building blocks on the receiving substrate further includes the following step: the plurality of functional building blocks are placed on different planes on the same side of the receiving substrate, so that orthogonal projections of the adjacent building blocks onto the receiving substrate overlap with each other.

In one embodiment of the invention, the at least one micro-device of each of the building blocks forms a micro-device array, a number of rows of the micro-device array is M, a number of columns of the micro-device array is N, and M and N are positive integers.

In one embodiment of the invention, each of the connecting devices includes a plurality of first connecting lines in a first direction and a plurality of second connecting lines in a second direction, a number of the first connecting lines is X, a number of the second connecting lines is Y, and X and Y are positive integers.

In one embodiment of the invention, X is greater than or equal to M, and Y is greater than or equal to N.

In one embodiment of the invention, the first connecting lines and the second connecting lines are made by a photolithography process.

Based on the above, as described in the embodiments of the invention, since each of the micro-device sets is repeatedly transferred from the transferring substrate onto a corresponding receiving block in the receiving blocks to form one of the building blocks, the time for alighting the micro-device set with the active area of the receiving block is greatly reduced. In addition, the moving distance of the micro-device set in transferring is also reduced, so as to save time and to increase accuracy in the manufacturing process. Further, the equipment used in transferring the micro-device set can be smaller to reduce cost but can have better efficiency.

Additionally, since the size of the active area of the receiving block is substantially equal to the size of the micro-device array of the corresponding micro-device set, the moving step of the transfer head can be much greater, for example, greater than 100 micro meters. Therefore, the time for moving the micro-device set is also greatly reduced.

Otherwise, the number of the micro-devices being transferred can be appropriately selected in the invention, so as to increase the yield rate. Further, since each of the building blocks is tested individually so that only functional building blocks are placed on the receiving substrate to form the micro-device panel. Therefore, it can be guaranteed that each micro-device panel works properly. In other words, the yield rate of the manufacturing process may achieve 100 percent, or at least, the failure rate of the manufacturing process is greatly reduced.

The abovementioned features and advantages of the invention will become more obvious and better understood with regard to the following description of the exemplary embodiments and accompanying drawings in the below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2L are schematic top views illustrating a manufacturing process of a micro-device panel according to an embodiment of the invention.

FIG. 3A to FIG. 3L are schematic front views illustrating the manufacturing process of the micro-device panel depicted in FIG. 2A to FIG. 2L, respectively.

DESCRIPTION OF THE EMBODIMENTS

Figure 1:
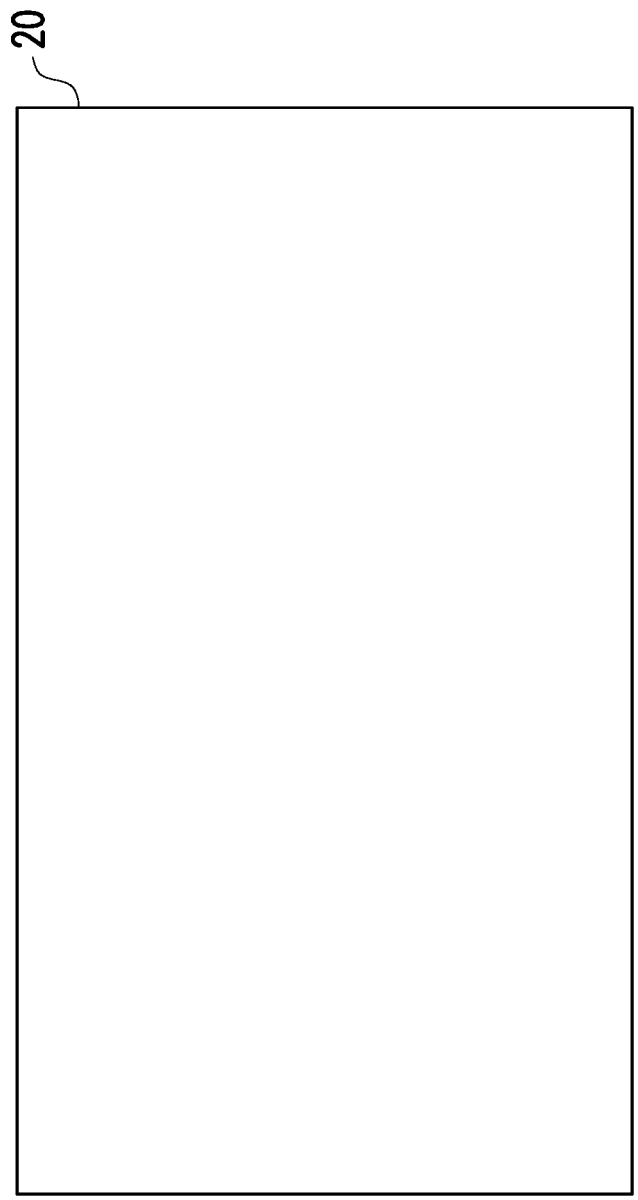
FIG. 1 is a schematic view illustrating a transferring unit and an active area in conventional technology.
Figure 1:
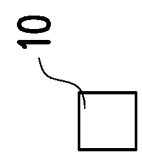

Reference will now be made in detail to the present preferred embodiments of the invention, examples of which are illustrated in the accompanying drawings. Wherever possible, the same reference numbers are used in the drawings and the description to refer to the same or like parts.

Figure 2A:
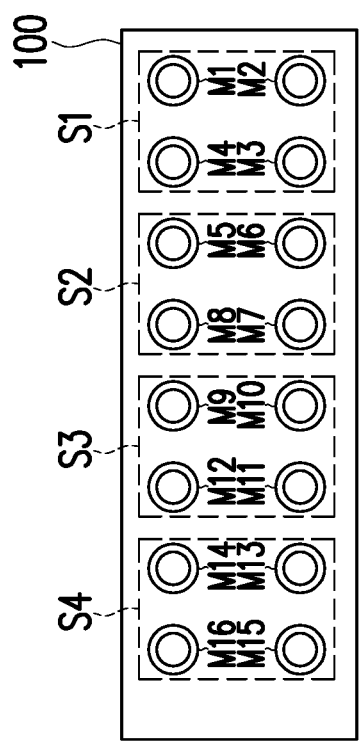

FIG. 2A to FIG. 2L are schematic top views illustrating a manufacturing process of a micro-device panel according to an embodiment of the invention, and FIG. 3A to FIG. 3L are schematic front views illustrating the manufacturing process of the micro-device panel depicted in FIG. 2A to FIG. 2L. To be more specific, FIG. 2A to FIG. 2L are respectively corresponding to FIG. 3A to FIG. 3L. For example, FIG. 2A and FIG. 3A, which is corresponding to FIG. 2A, are respectively the schematic top view and the schematic front view illustrating the manufacturing process of the micro-device panel at a specific time point. The corresponding figures will be described simultaneously hereinafter. In addition, FIG. 4 is a flowchart diagram illustrating a manufacturing process of a micro-device panel according to an embodiment of the invention.

Figure 3A:
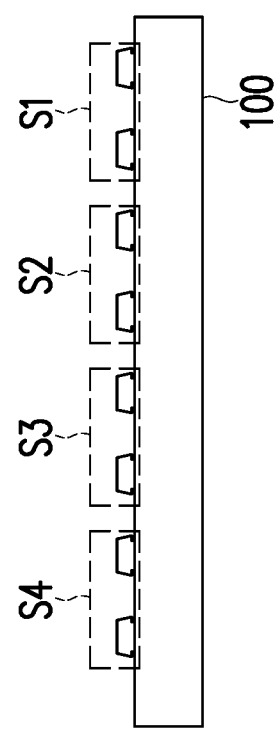
Figure 4:
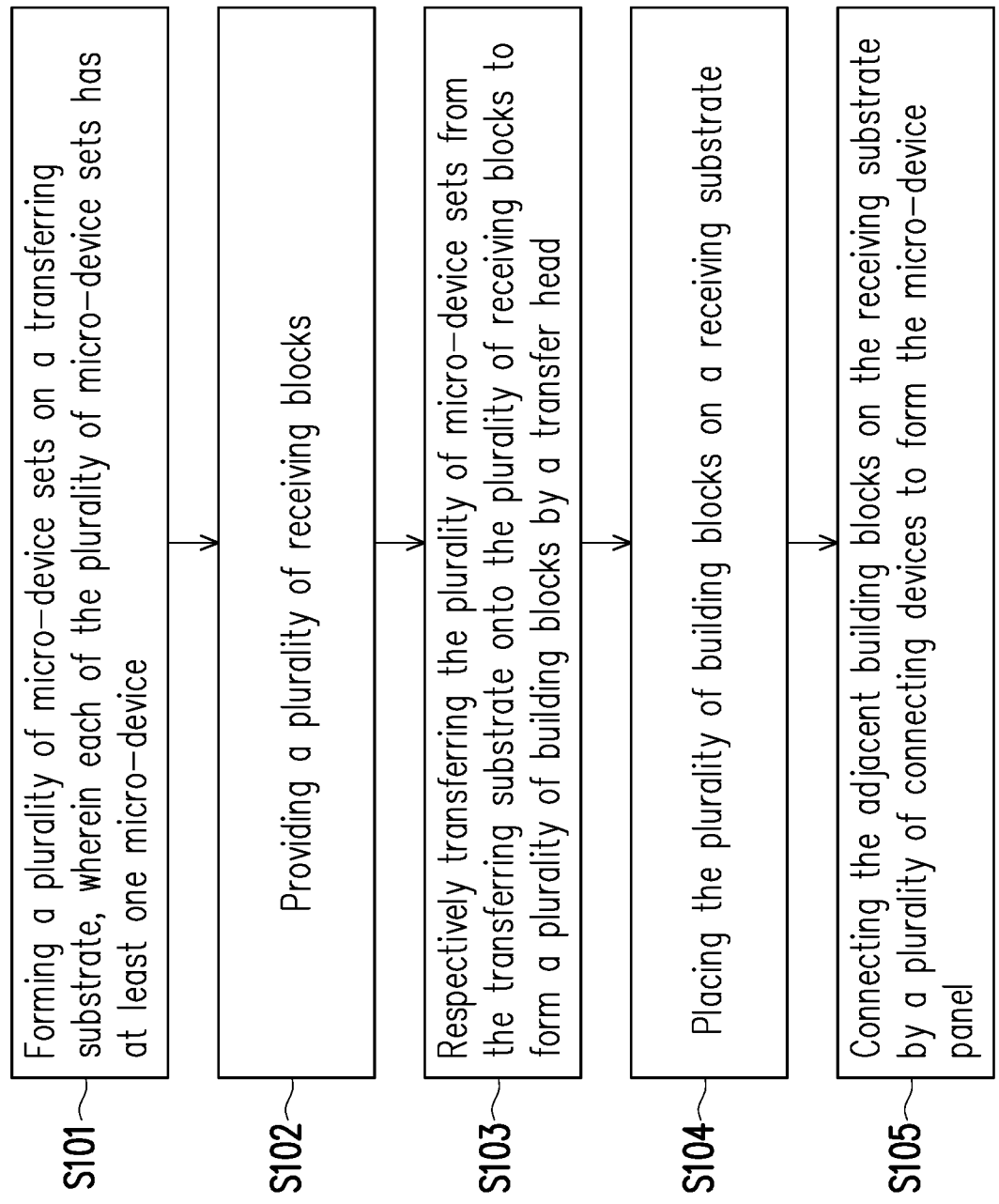
FIG. 4 is a flowchart diagram illustrating a manufacturing process of a micro-device panel according to an embodiment of the invention.

Referring to FIGS. 2A and 3A simultaneously, a plurality of micro-device sets S1-S4 are formed on a transferring substrate 100, and each of the plurality of micro-device sets S1-S4 has at least one micro-devices (Step S101 in FIG. 4). Specifically, in the present embodiment, there are four micro-device sets S1-S4 formed on the transferring substrate 100. Further, the micro-device set S1 has four micro-devices M1-M4, the micro-device set S2 has four micro-devices M5-M8, the micro-device set S3 has four micro-devices M9-M12, and the micro-device set S4 has four micro-devices M13-M16. It should be noted here, there are four micro-device sets S1-S4 and each of the four micro-device sets S1-S4 has four micro-devices in the present embodiment, but the number of the micro-device sets and the number of the micro-devices of each micro-device set are not limited thereto. In other embodiments of the invention, the number of the micro-device sets may be greater than or equal to 2, and each micro-device set has one or more micro-devices.

In the present embodiment, the four micro-devices of each of the micro-device sets S1-S4 forms a micro-device array. However, the invention is not limited thereto, the micro-devices of the micro-device set may form a circular shape, a triangle shape, etc.

Figure 2B:
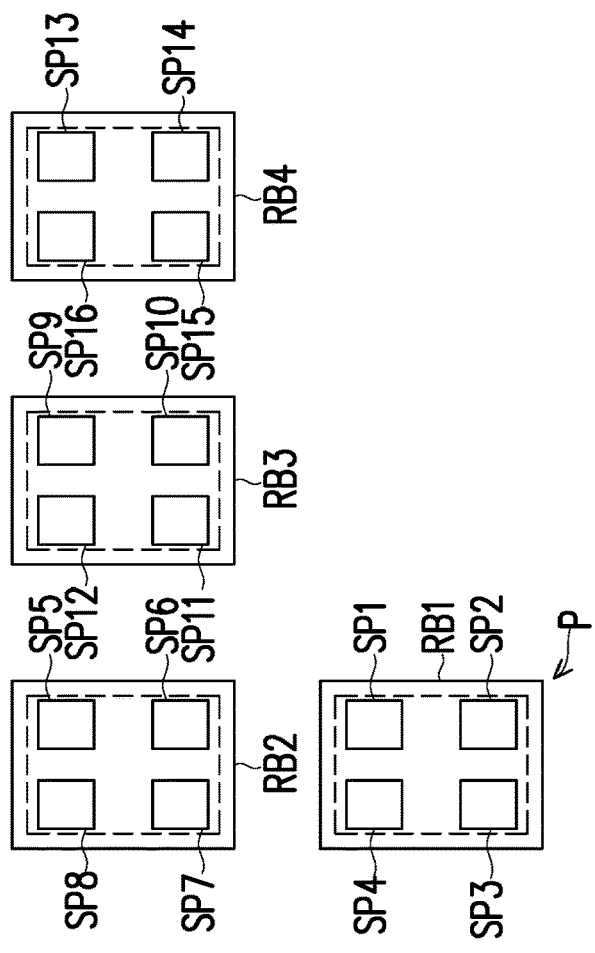
Figure 2B:
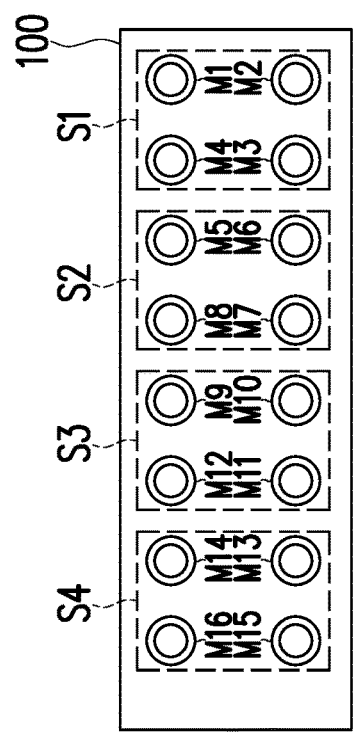
Figure 3B:
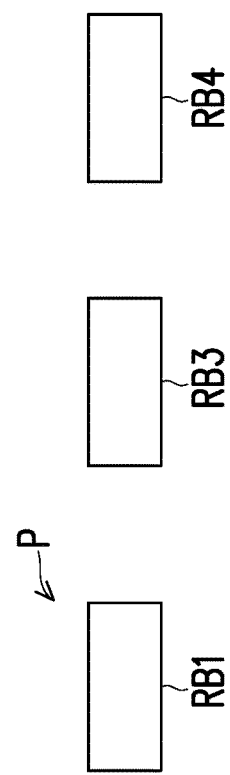
Figure 3B:
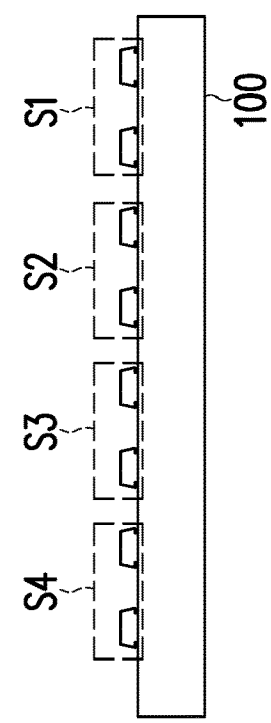

Next, referring to FIGS. 2B and 3B simultaneously, a plurality of receiving blocks RB1-RB4 are provided (Step 102 in FIG. 4), and each of the receiving blocks RB1-RB4 includes an active area having at least one sub-pixels. In the present embodiment, four receiving blocks RB1-RB4 are provided. Further, the receiving block RB1 has four sub-pixels SP1-SP4, the receiving block RB2 has four sub-pixels SP5-SP8, the receiving block RB3 has four sub-pixels SP9-SP12, and the receiving block RB4 has four sub-pixels SP13-SP16.

It should be noted here, the plurality of micro-device sets S1-S4 are in one-to-one correspondence with the plurality of receiving blocks RB1-RB4. That is, the micro-device set S1 is corresponding to the receiving block RB1, the micro-device set S2 is corresponding to the receiving block RB2, the micro-device set S3 is corresponding to the receiving block RB3, and the micro-device set S4 is corresponding to the receiving block RB4. Similarly, there are four receiving blocks depicted in FIGS. 2B and 3B, but the number of the receiving blocks in the invention is not limited thereto. In other embodiments of the invention, the number of the receiving blocks may be greater than or equal to 2 as long as the number of the receiving blocks is equal to the number of the micro-device sets. Further, the number of the micro-devices in one micro-device set is equal to the number of the sub-pixels in the corresponding receiving block.

Referring to FIG. 2C to FIG. 2L and FIG. 3C to FIG. 3L, the plurality of micro-device sets S1-S4 are respectively transferred from the transferring substrate 100 onto the plurality of receiving blocks RB1-RB4 to form a plurality of building blocks BB1-BB4 by a transfer head 200 (Step S103 in FIG. 4). The details will be described hereinafter.

Figure 2C:
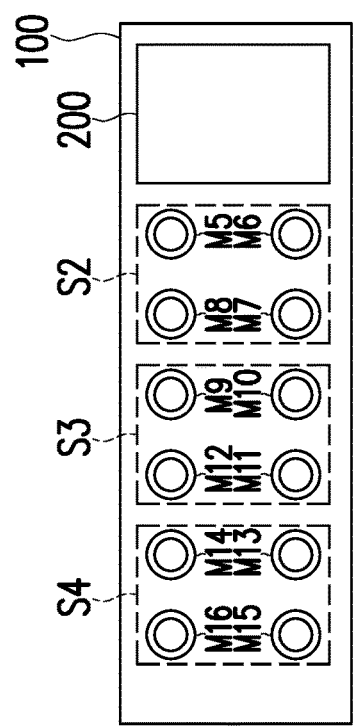
Figure 2C:
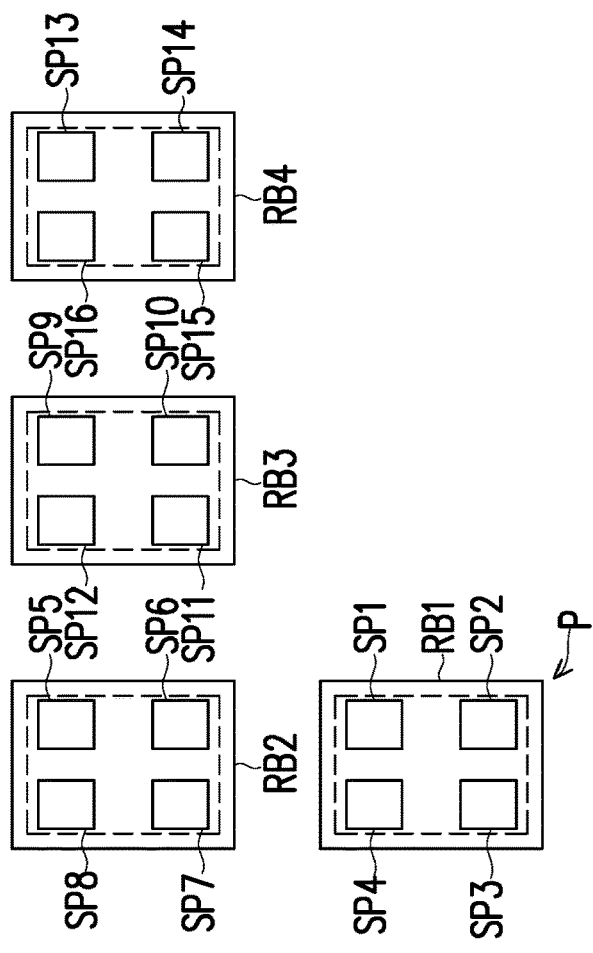
Figure 3C:
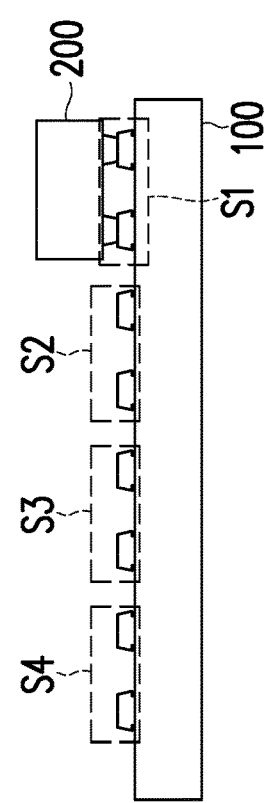
Figure 3C:
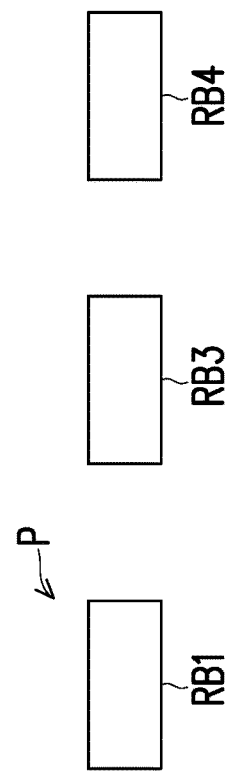
Figure 2D:
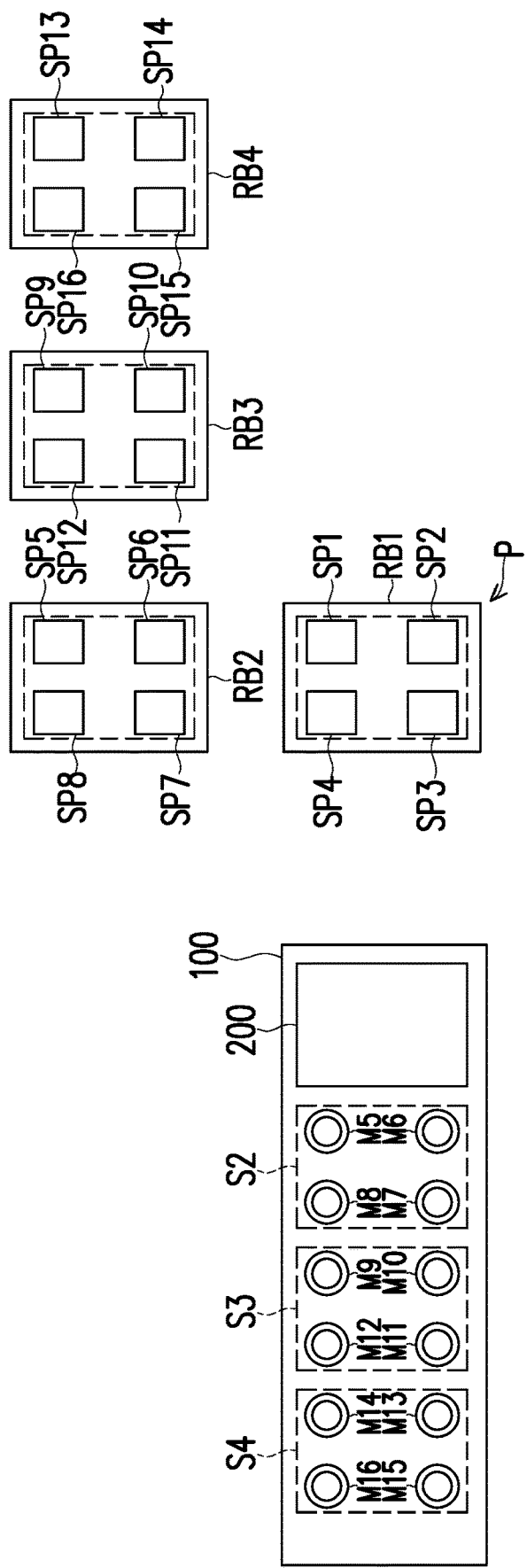
Figure 3D:
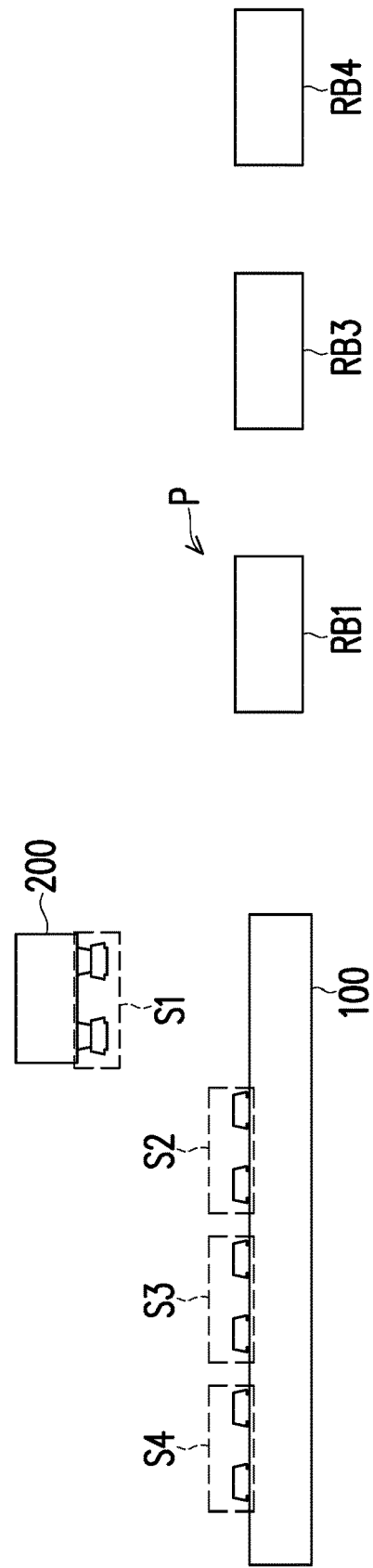
Figure 2E:
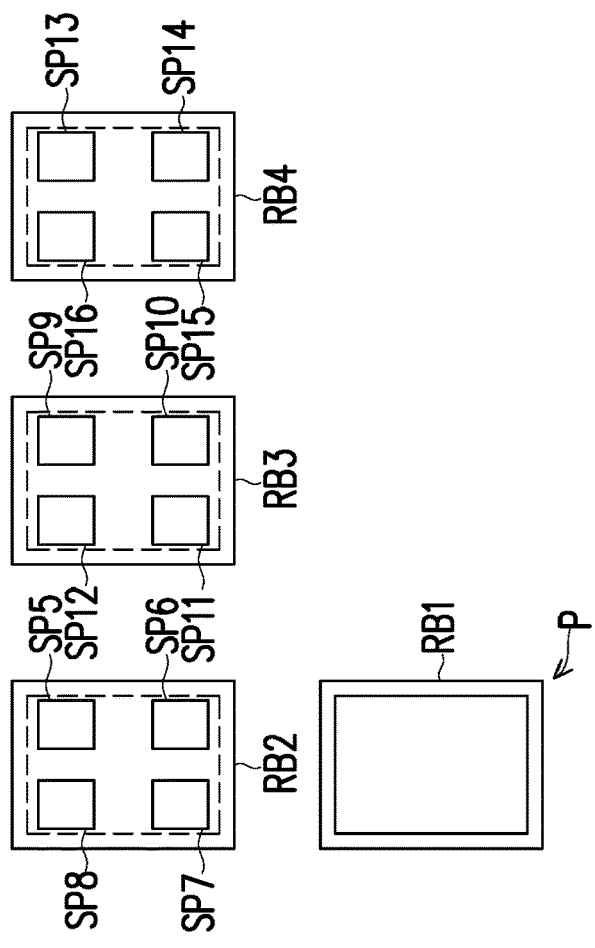
Figure 2E:
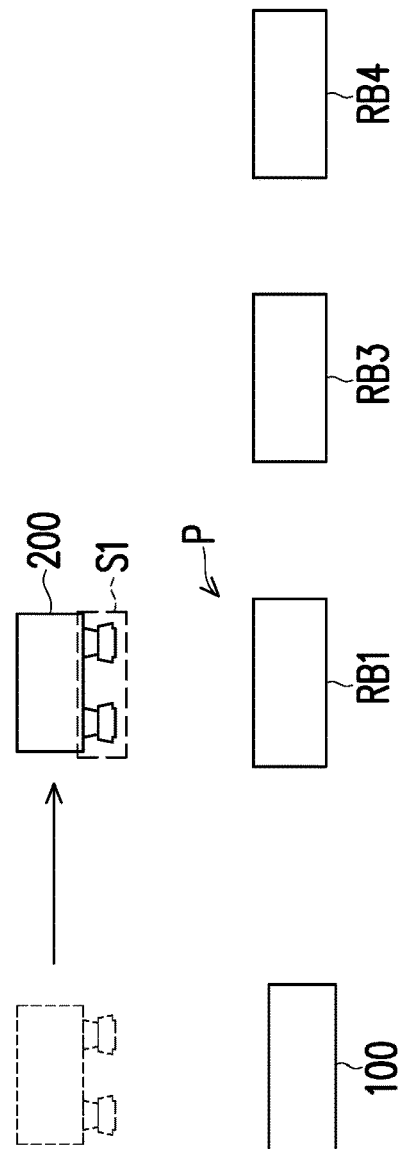
Figure 3E:
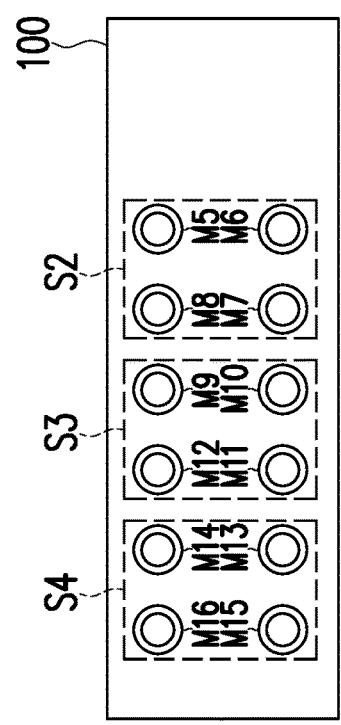
Figure 3E:
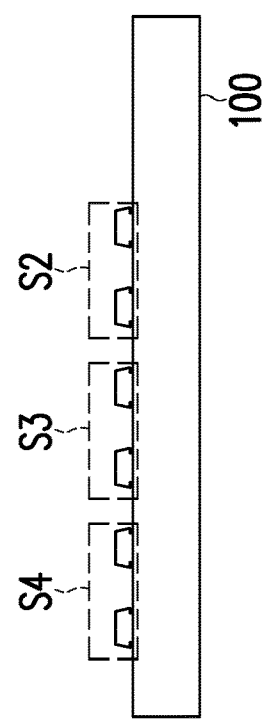
Figure 2F:
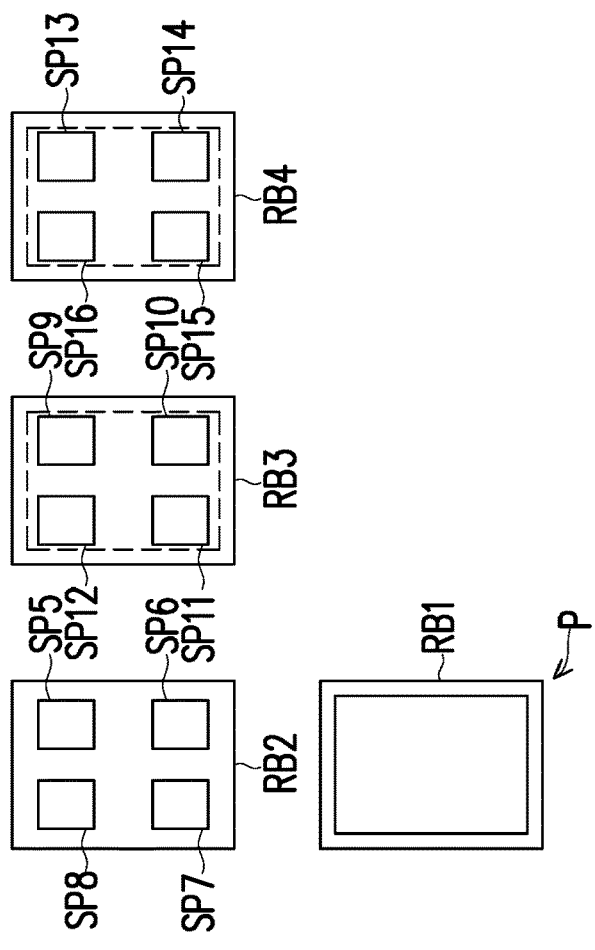
Figure 2F:
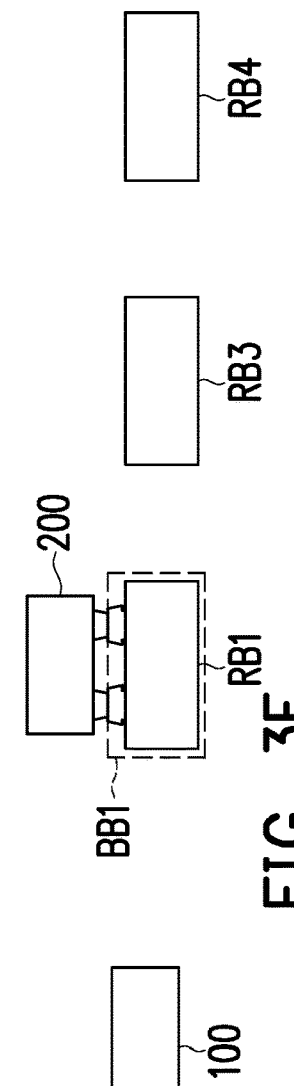
Figure 2F:
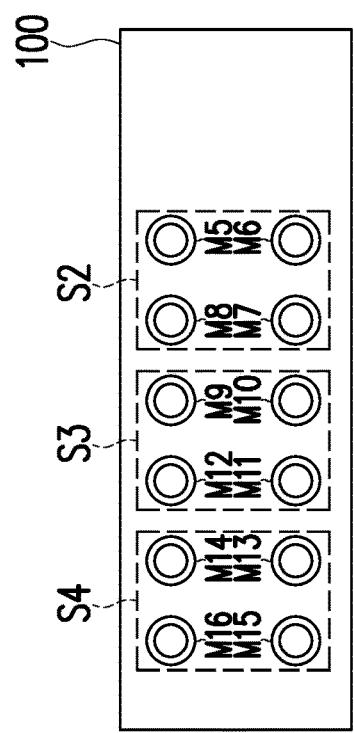
Figure 3F:
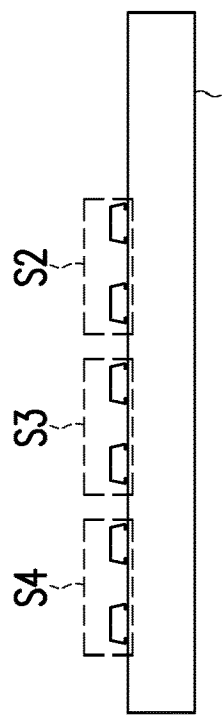
Figure 2G:
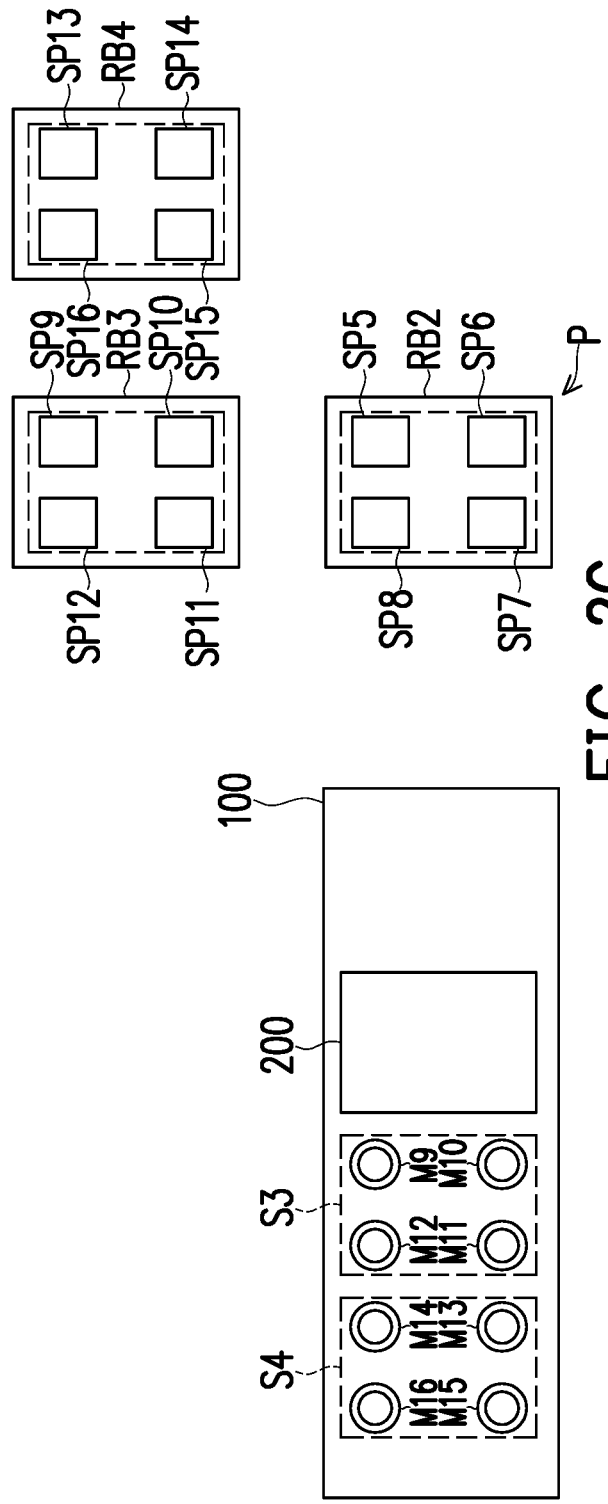
Figure 3G:
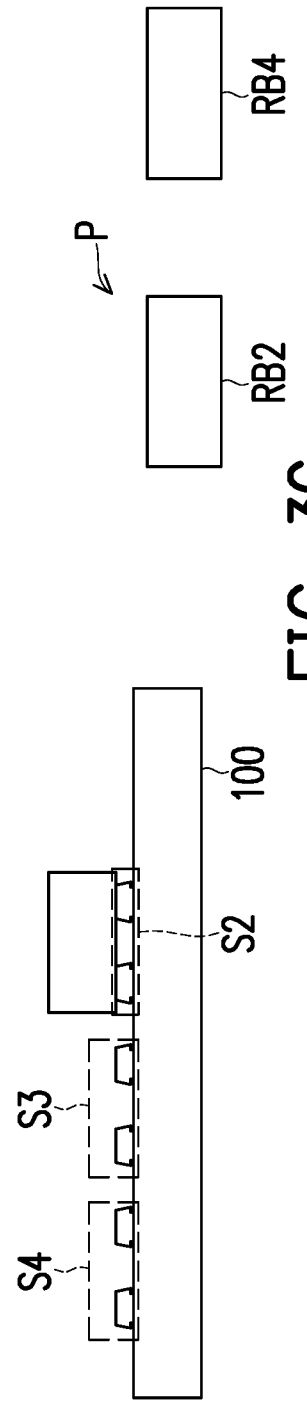
Figure 2H:
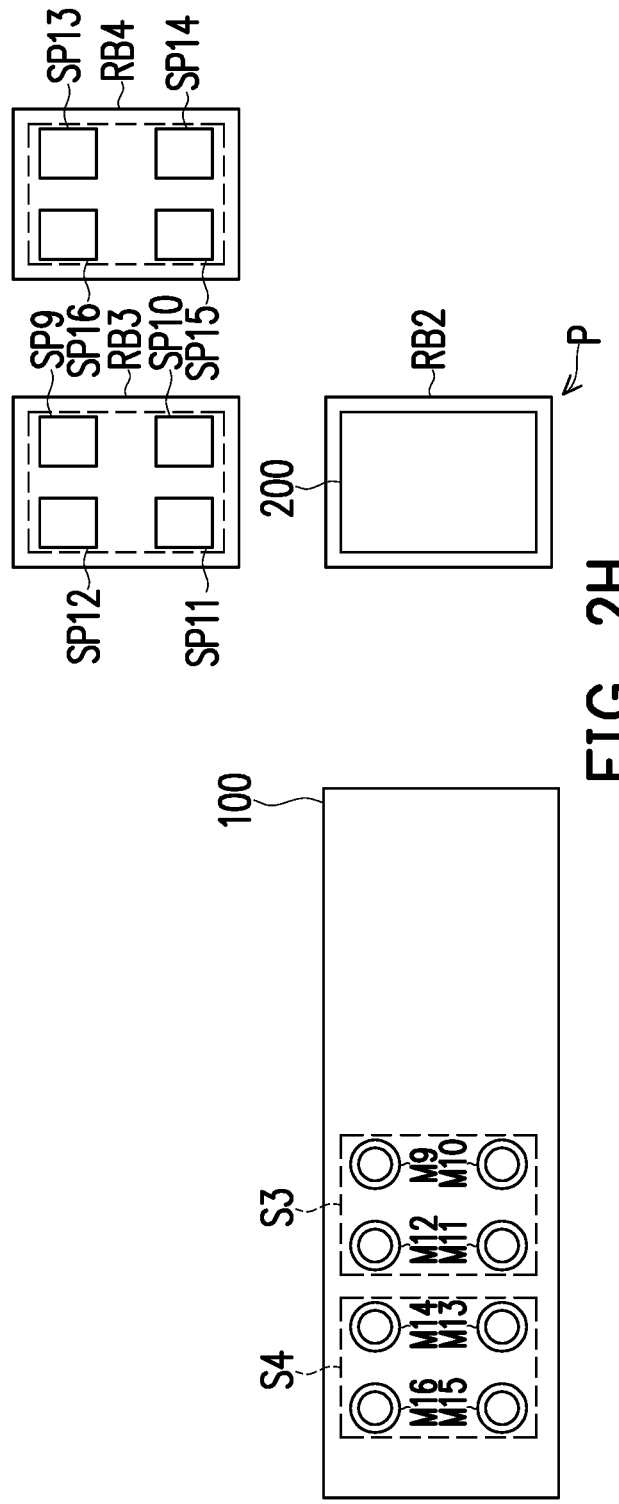
Figure 3H:
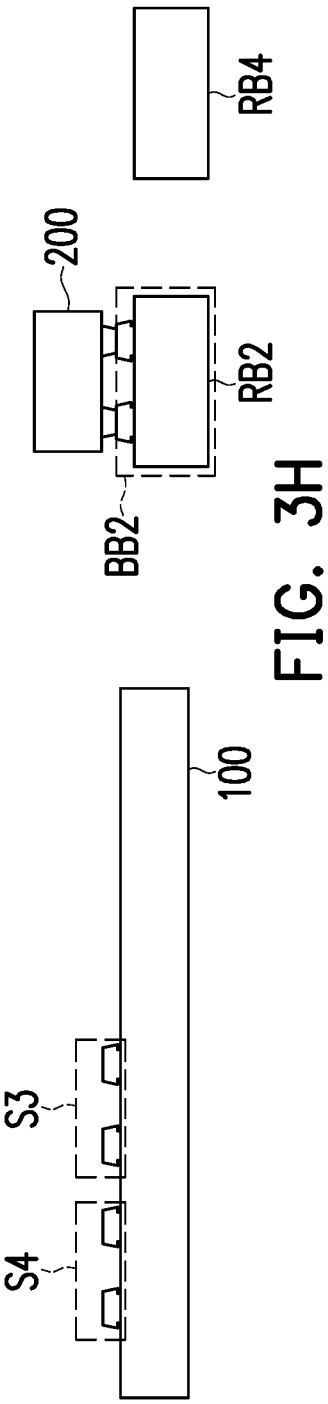
Figure 2I:
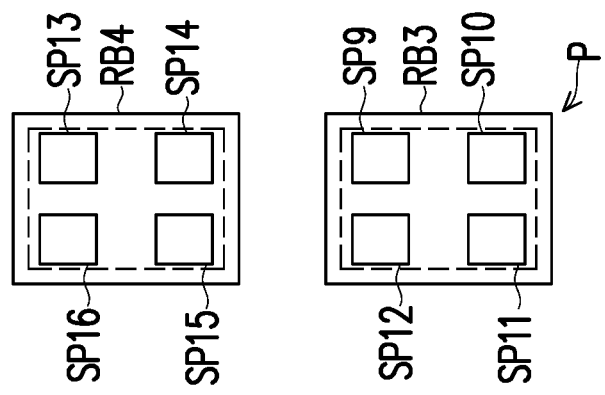
Figure 2I:
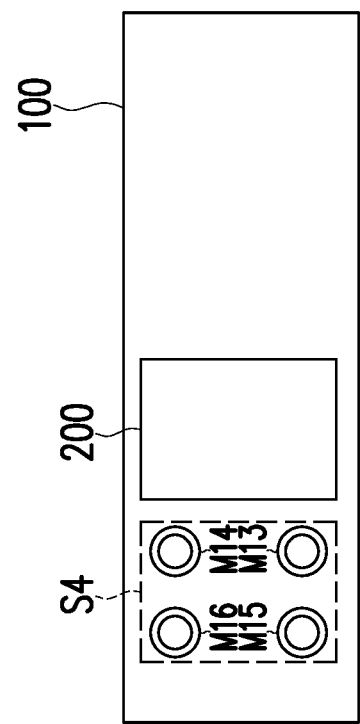
Figure 3I:
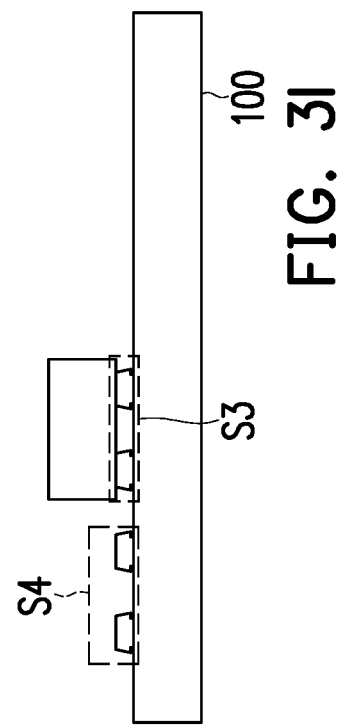

Firstly, referring to FIGS. 2C and 3C simultaneously, the receiving block RB1 is fixed to a position P, the transfer head 200 is controlled to be in contact with four micro-devices M1-M4 of the micro-device set S1. The method of controlling the transfer head 200 is not limited in the invention. Next, the transfer head 200 picks up the four micro-devices M1-M4 of the micro-device set S1 from the transferring substrate 100 as shown in FIGS. 2D and 3D, and the transfer head 200 moves the four micro-devices M1-M4 of the micro-device set S1 along a direction (shown by an arrow in FIG. 3E) in order to align the micro-device set S1 with the receiving block RB1 at the position P, as shown in FIGS. 2E and 3E. After the alignment, the transfer head 200 places the four micro-devices M1-M4 of the micro-device set S1 onto the receiving block RB1 to form the building block BB1. At this time, the micro-device array of the micro-device set S1 is corresponding to the active area of the receiving block RB1 and the four micro-devices M1-M4 are disposed corresponding to the four sub-pixels SP1-SP4. In other words, the building block BB1 includes the receiving block RB1 and the four micro-devices M1-M4 that are respectively disposed in the four sub-pixels SP1-SP4 of the receiving block RB1. It should be noted here, the size of the active area of the receiving block RB1 is substantially equal to the size of the micro-device array of the micro-device set S1. Therefore, the four micro-devices M1-M4 of the micro-device set S1 are transferred from the transferring substrate 100 onto the receiving block RB1, which is corresponding to the micro-device set S1, to form the building block BB1. After that, the building block BB1 is replaced by the receiving block RB2 so the receiving block RB2 is fixed to the position P, and the building block BB1 is tested to determine whether it properly function.

Sequentially with the same manner, the four micro-devices M5-M8 of the micro-device set S2 are transferred from the transferring substrate 100 onto the receiving block RB2 so the four micro-devices M5-M8 are respectively disposed in the four sub-pixels SP5-SP8, the four micro-devices M9-M12 of the micro-device set S3 are transferred from the transferring substrate 100 onto the receiving block RB3 so the four micro-devices M9-M12 are respectively disposed in the four sub-pixels SP9-SP12, and the four micro-devices M13-M16 of the micro-device set S4 are transferred from the transferring substrate 100 onto the receiving block RB4 so the four micro-devices M13-M16 are respectively disposed in the four sub-pixels SP13-SP16, as shown in FIGS. 2G to 2L and FIGS. 3G to 3L. Therefore, the micro-device sets S1-S4 are respectively, one by one, transferred onto the receiving blocks RB1-RB4 in order to form the building blocks BB1-BB4. In other words, each of the micro-device sets S1-S4 is repeatedly transferred from the transferring substrate 100 onto a corresponding receiving block in the receiving blocks RB1-RB4 to form one of the building blocks BB1-BB4.

Furthermore, each of the receiving blocks RB1-RB4 is fixed to one specific position P in order to receive a corresponding micro-device set in the micro-device sets S1-S4, but the invention is not limited thereto. In other embodiments of the invention, there may have more than two positions that the receiving blocks can be fixed to.

In the present embodiment, since each of the receiving blocks RB1-RB4 sequentially is fixed to one specific position P in order to receive a corresponding micro-device set in the micro-device sets S1-S4, the time for aligning the micro-device set with the active area of the receiving block is greatly reduced.

Otherwise, in conventional technique, the size of the active area is much larger than the size of the micro-device array including, for example, 100×100 micro-devices. Therefore, when the micro-device array is moved by the transfer head above the active area, the moving step of the transfer head must be very small, for example, must be smaller than 100 micro meters in order to position the micro-device array. However, in the present embodiment, since the size of the active area of each of the receiving blocks RB1-RB4 is substantially equal to the size of the micro-device array of the corresponding one in the micro-device sets S1-S4, the moving step of the transfer head can be much greater, for example, greater than 100 micro meters. Therefore, the time for moving the micro-device set is also greatly reduced.

It should be noted here, after being formed, each of the building blocks BB1-BB4 is tested individually so that each of the building blocks BB1-BB4 is determined whether to be functional. If one of the building blocks BB1-BB4 is dysfunctional, it will be replaced by another functional building block formed by the same manufacturing process described above. As a result, four functional building blocks are formed in the present embodiment. For ease of description, it is assumed that the four building blocks BB1-BB4 are all functional in the present embodiment. However, the number of functional building blocks in the invention is not limited thereto, and the number of functional building blocks being formed is based on requirements.

Figure 5A:
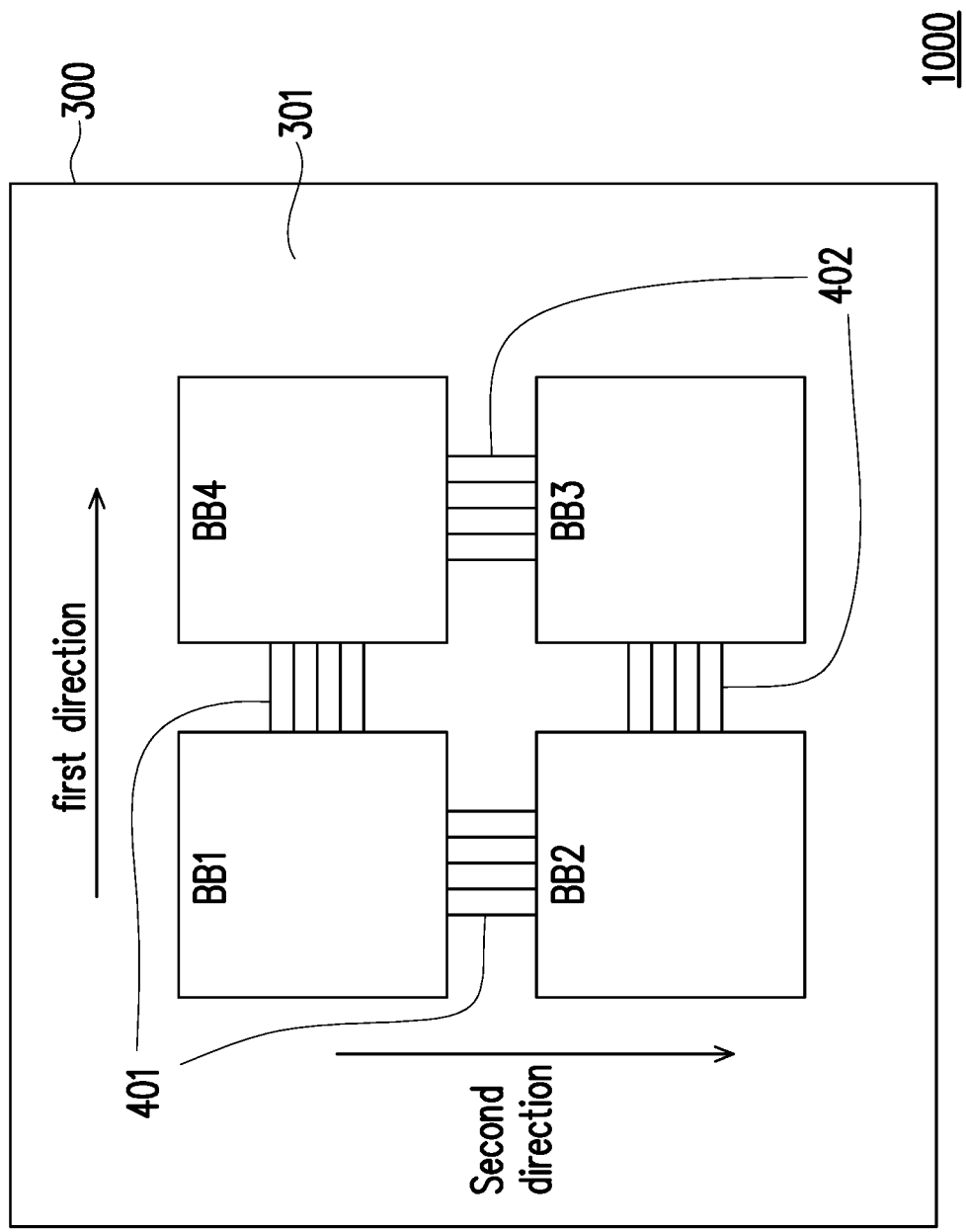
FIG. 5A is a schematic view illustrating a micro-device panel according to an embodiment of the invention.
Figure 5B:
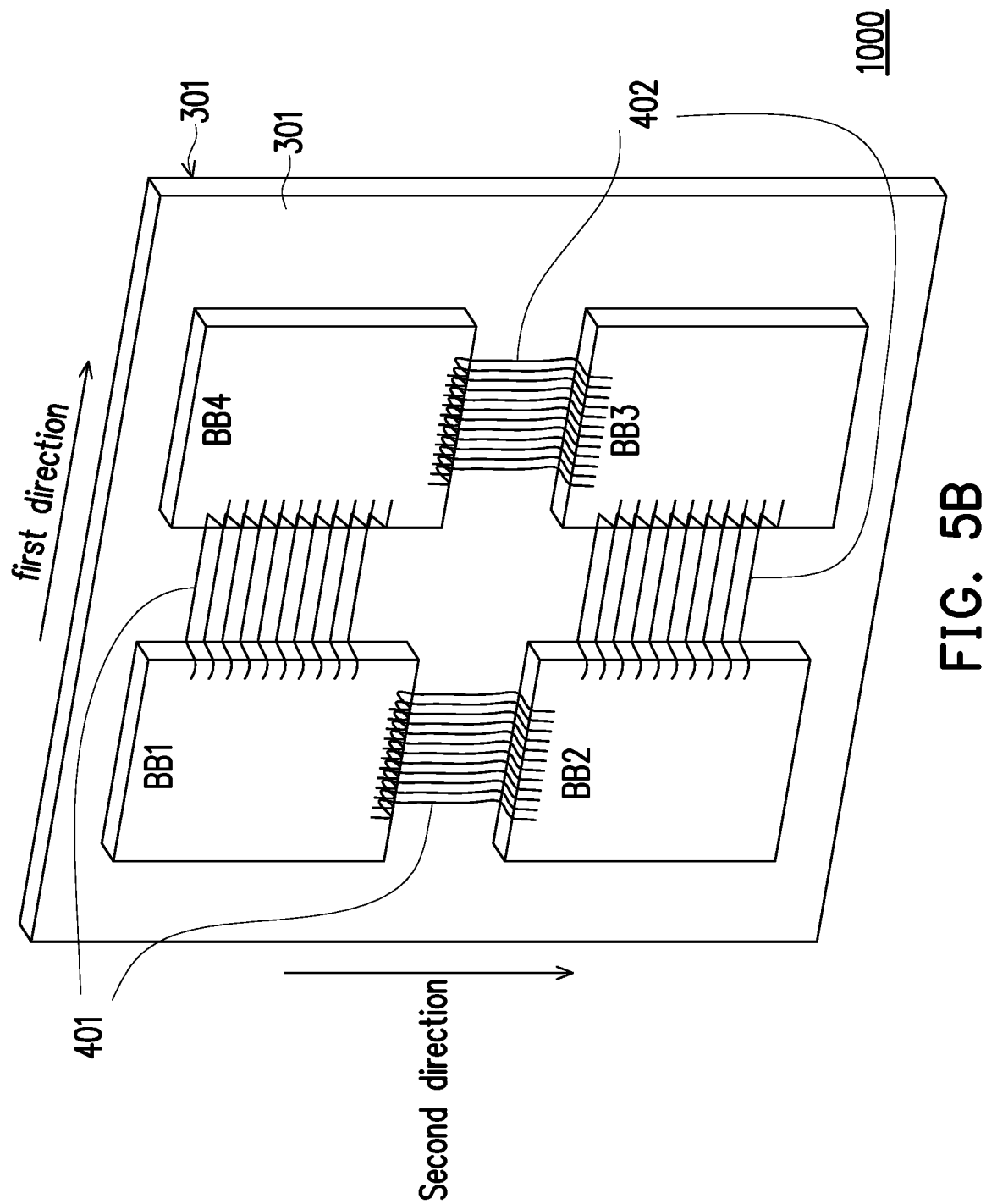
FIG. 5B is a three-dimensional schematic view illustrating the micro-device panel shown in FIG. 5A.

FIG. 5A is a schematic view illustrating a micro-device panel according to an embodiment of the invention, and FIG. 5B is a three-dimensional schematic view illustrating the micro-device panel shown in FIG. 5A.

Next, referring to FIG. 5A and FIG. 5B, the functional four building blocks BB1-BB4 after being formed are placed on a receiving substrate 300 (Step S104 in FIG. 4). The method of placing the building blocks on the receiving substrate is not limited in the present application.

In the present embodiment, as shown in FIG. 5A and FIG. 5B, the four functional building blocks BB1-BB4 are placed on a plane 301 of the receiving substrate 300.

Finally, the adjacent building blocks (such as the adjacent building blocks BB1, BB2, and BB4, and the adjacent building blocks BB2, BB3, and BB4) on the receiving substrate 300 are connected by a plurality of connecting devices 401 and 402 to form a micro-device panel 1000 (Step S105 in FIG. 4). There are two connecting devices 401 and 402 in the present embodiment, but the invention is not limited thereto. In other embodiments, the number of the connecting devices depends on the number of the building blocks.

To be more specific, each of the connecting devices 401 and 402 includes a plurality of first connecting lines in a first direction D1 and a plurality of second connecting lines in a second direction D2, as shown in FIG. 5A and FIG. 5B. The first connecting lines in the first direction D1 of the connecting device 401 are used to connect between the two adjacent building blocks BB1 and BB4, the second connecting lines in the second direction D2 of the connecting device 401 are used to connect between the two adjacent building blocks BB1 and BB2. In addition, the first connecting lines in the first direction D1 of the connecting device 402 are used to connect between the two adjacent building blocks BB2 and BB3, and the second connecting lines in the second direction D2 of the connecting device 402 are used to connect between the two adjacent building blocks BB3 and BB4. As shown in FIG. 5A, the number of the first connecting lines in each of the connecting devices 401 and 402 is five and the number of the second connecting lines in each of the connecting devices 401 and 402 is also five. On the other hand, the number of rows of the micro-device array in each of the building blocks BB1-BB4 is two, and the number of columns of the micro-device array in each of the building blocks BB1-BB4 is two. Therefore, the number of the first connecting lines in the first direction D1 of the connecting device 401 is greater than the number of rows of the micro-device array in each of the two adjacent building blocks BB1 and BB4, and the number of the second connecting lines in the second direction D2 of the connecting device 401 is greater than the number of columns of the micro-device array in each of the two adjacent building blocks BB1 and BB2. Similarly, the number of the first connecting lines in the first direction D1 of the connecting device 402 is greater than the number of rows of the micro-device array in each of the two adjacent building blocks BB2 and BB3, and the number of the second connecting lines in the second direction D2 of the connecting device 402 is greater than the number of columns of the micro-device array in each of the two adjacent building blocks BB3 and BB4.

In other embodiments of the invention, one connecting device connects three adjacent building blocks in the first and second directions by the first connecting lines and the second connecting lines, respectively. The number of the first connecting lines is X, the number of the second connecting lines is Y, and X and Y are positive integers. The number of rows of the micro-device array in each of the two adjacent building blocks in the first direction is M, the number of columns of the micro-device array in each of the two adjacent building blocks in the second direction is N, and M and N are positive integers. The conditions X, Y, M, and N must be satisfied are that X is greater than or equal to M, and Y is greater than or equal to N.

It should be noted here, the first connecting lines and the second connecting lines are made by the photolithography process in the invention.

Further, since each of the building blocks BB1-BB4 is tested individually so that only functional building blocks are placed on the receiving substrate 300 to form the micro-device panel 1000. Therefore, it can be guaranteed that each micro-device panel 1000 works properly after being manufactured. In other words, the yield rate of the manufacturing process may achieve 100 percent, or at least the failure rate of the manufacturing process is greatly reduced.

Figure 6:
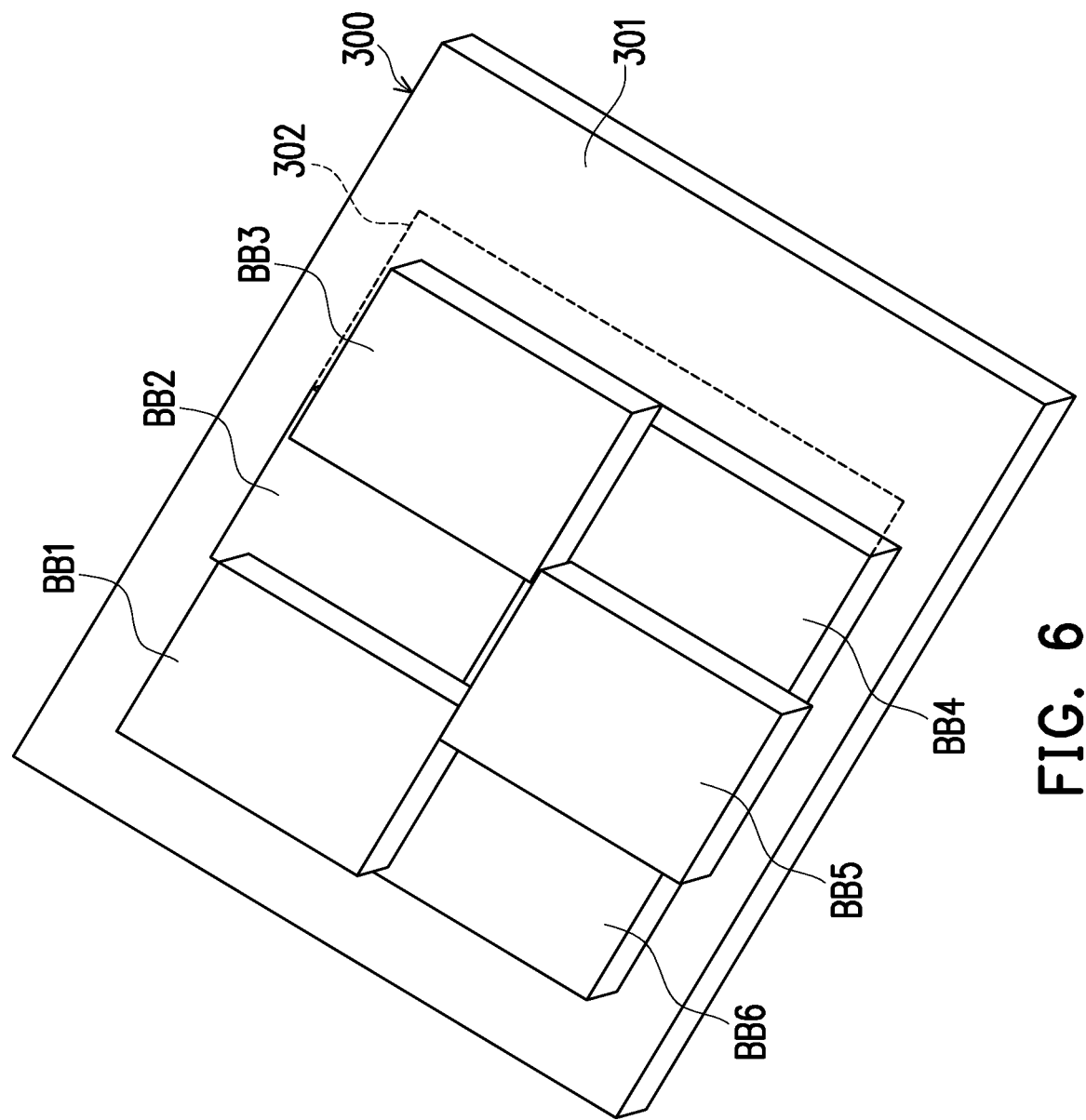
FIG. 6 is a three-dimensional schematic view illustrating a micro-device panel according to another embodiment of the invention.

In another embodiment of the present application, there are six building blocks BB1-BB6 and the six building blocks BB1-BB6 are placed on different planes 301 and 302 on the same side of the receiving substrate 300, so that orthogonal projections of the adjacent building blocks, i.e., the adjacent building blocks BB1 and BB2, onto the receiving substrate 300 overlap with each other, as shown in FIG. 6.

Figure 7:
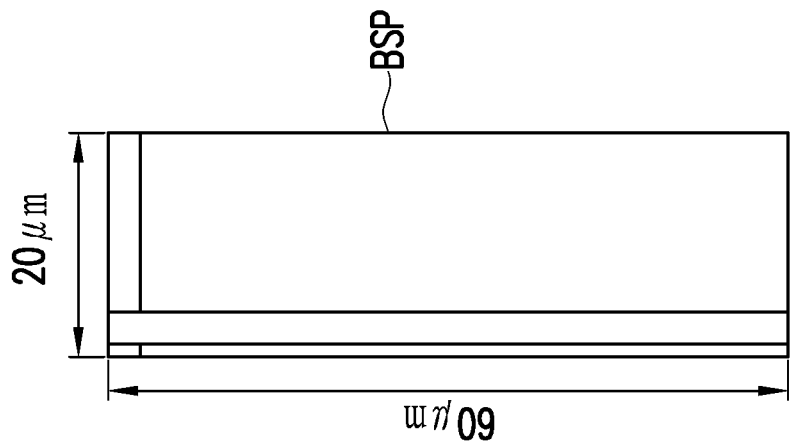
FIG. 7 is a schematic view illustrating a true ratio between dimensions of a micro-device and dimensions of a sub-pixel according to an embodiment of the invention.
Figure 7:
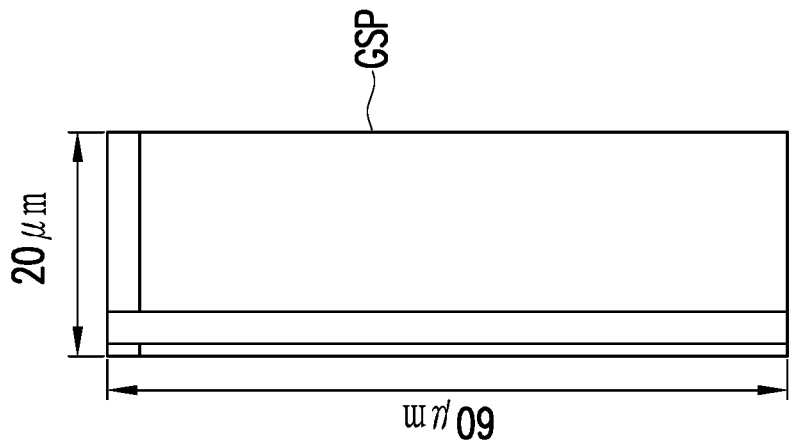
Figure 7:
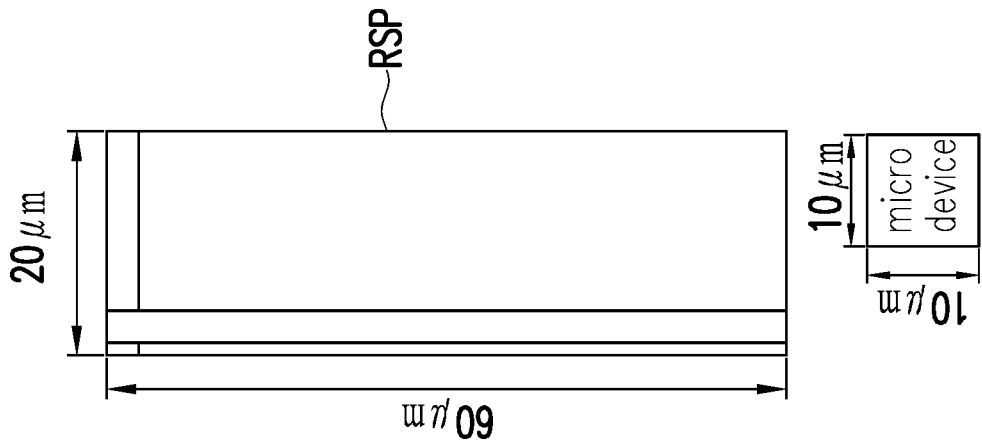

FIG. 7 is a schematic view illustrating a true ratio between dimensions of a micro-device and dimensions of each sub-pixel according to the present embodiment of the invention. FIG. 7 shows one red sub-pixel RSP, one blue sub-pixel BSP, and one green sub-pixel GSP for 5 inches full HD screen (1920×1080), and one micro-device. Dimensions of the red sub-pixel RSP, the blue sub-pixel BSP, and the green sub-pixel GSP are substantially equal to each other. To be more specific, the width and the length of each of the red sub-pixel RSP, the blue sub-pixel BSP, and the green sub-pixel GSP are 20 micrometres and 60 micrometres, respectively. Additionally, the width and the length of the micro-device are both equal to 10 micrometres.

Figure 8:
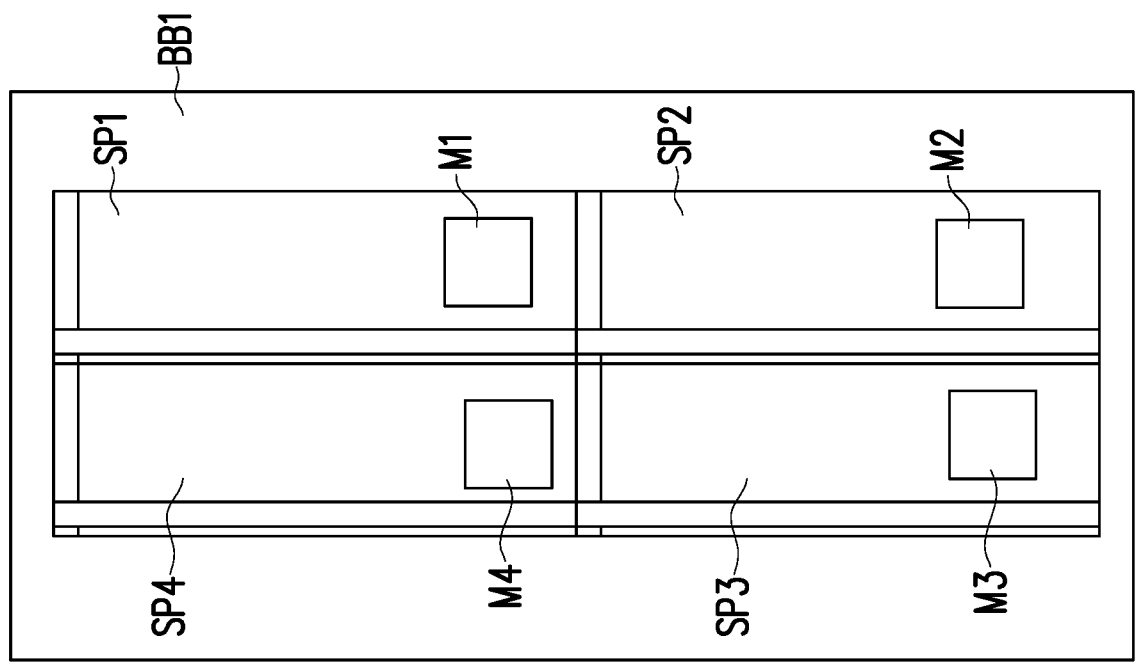
FIG. 8 is a schematic view illustrating one building block of a micro-device panel according to an embodiment of the invention.

FIG. 8 is a schematic view illustrating one building block of the micro-device panel according to an embodiment of the invention. As shown in FIG. 8, the building block BB1 of the present application has four sub-pixels SP1-SP4 and four micro-devices M1-M4 that are respectively disposed in the four sub-pixels SP1-SP4.

Figure 9:
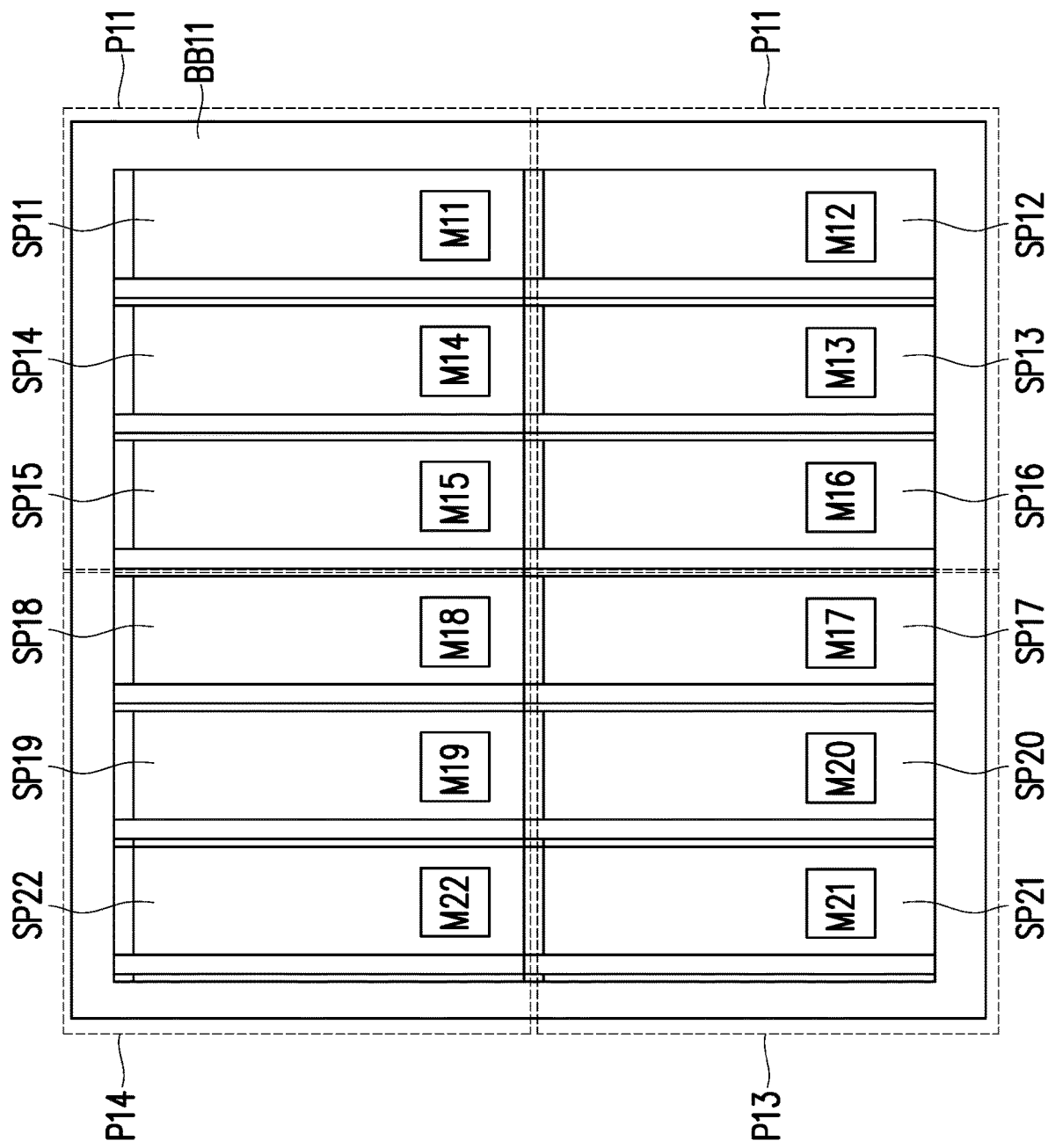
FIG. 9 is a schematic view illustrating one building block of a micro-device panel according to another embodiment of the invention.

In another embodiment of the invention, one building block may have more than four sub-pixels and more than four micro-devices. For example, FIG. 9 is a schematic view illustrating one building block according to another embodiment of the invention. As shown in FIG. 9, a building block BB11 may have twelve sub-pixels SP11-SP22, and each of the twelve sub-pixels is categorized as red sub-pixel, blue sub-pixel, or green sub-pixel. In addition, the combination of one red sub-pixel, one blue sub-pixel, and one green sub-pixel adjacent to each other form one pixel. For example, the building block BB11 may have 4 pixels P11-P14 formed by twelve sub-pixels SP11-SP22. Moreover, the building block BB11 may have twelve micro-devices M11-M22, and the twelve micro-devices M11-M22 are respectively disposed in the 12 sub-pixels SP11-SP22. The micro-devices M11-M22 serve as light sources, for example. However, the invention is not limited there to, the number of micro-devices and the number of sub-pixels in one building block may be greater than or equal one in other embodiments.

Summarily, in the invention, since each of the receiving blocks is fixed to one specific position in order to receive a corresponding micro-device set, the time for alighting the micro-device set with the active area of the receiving block is greatly reduced. In addition, the moving distance of the micro-device set in transferring is also reduced, so as to save time and to increase accuracy in the manufacturing process. Further, the equipment used in transferring the micro-device set can be smaller to reduce cost but can have better efficiency.

Additionally, since the size of the active area of the receiving block is substantially equal to the size of the micro-device array of the corresponding micro-device set, the moving step of the transfer head can be much greater, for example, greater than 100 micro meters. Therefore, the time for moving the micro-device set is also greatly reduced.

Otherwise, the number of the micro-devices being transferred can be appropriately selected in the invention, so as to increase the yield rate. Further, since each of the building blocks is tested individually so that only functional building blocks are placed on the receiving substrate to form the micro-device panel. Therefore, it can be guaranteed that each micro-device panel works properly. In other words, the yield rate of the manufacturing process may achieve 100 percent, or at least, the failure rate of the manufacturing process is greatly reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A manufacturing process for a micro-device panel, comprising:
   forming a plurality of micro-device sets on a transferring substrate, wherein each of the plurality of micro-device sets has at least one micro-device;
   providing a plurality of receiving blocks;
   respectively transferring the plurality of micro-device sets from the transferring substrate onto the plurality of receiving blocks to form a plurality of building blocks by a transfer head;
   placing the plurality of building blocks on a receiving substrate; and
   connecting the adjacent building blocks on the receiving substrate by a plurality of connecting devices to form the micro-device panel,
   wherein each of the plurality of receiving blocks is sequentially fixed to one specific position in order to receive a corresponding micro-device set in the plurality of micro-device sets.

2. The manufacturing process for the micro-device panel as recited in claim 1, wherein the plurality of micro-device sets are in one-to-one correspondence with the plurality of receiving blocks, and the step of respectively transferring the plurality of micro-device sets from the transferring substrate onto the plurality of receiving blocks to form the plurality of building blocks by the transfer head further comprises:
   repeatedly transferring each of the plurality of micro-device sets from the transferring substrate onto a corresponding receiving block in the plurality of receiving blocks to form one of the building blocks; and
   testing each of the building blocks, so as to determine a plurality of functional building blocks.

3. The manufacturing process for the micro-device panel as recited in claim 2, wherein the at least one micro-device of each of the plurality of micro-device sets forms a micro-device array, each of the receiving blocks comprises an active area having at least one sub-pixel, and the step of repeatedly transferring each of the plurality of micro-device sets from the transferring substrate onto the corresponding receiving block in the plurality of receiving blocks to form one of the building blocks further comprises:
   picking up one of the plurality of micro-device sets from the transferring substrate;
   moving and aligning the one of the plurality of micro-device sets with one of the receiving blocks corresponding to the one of the plurality of micro-device sets;
   placing the one of the plurality of micro-device sets onto the one of the receiving blocks, so that the micro-device array is corresponding to the active area and the at least one micro-device is disposed corresponding to the at least one sub-pixel.

4. The manufacturing process for the micro-device panel as recited in claim 3, wherein a number of the at least one micro-device in the micro-device array of each of the plurality of micro-device sets is equal to a number of the at least one sub-pixel in the active area of the corresponding receiving block in the plurality of receiving blocks.

5. The manufacturing process for the micro-device panel as recited in claim 2, wherein the step of placing the plurality of building blocks on the receiving substrate further comprises:
   placing the plurality of functional building blocks on a same plane of the receiving substrate.

6. The manufacturing process for the micro-device panel as recited in claim 2, wherein the step of placing the plurality of building blocks on the receiving substrate further comprises:
   placing the plurality of functional building blocks on different planes on a same side of the receiving substrate, so that orthogonal projections of the adjacent building blocks onto the receiving substrate overlap with each other.

7. The manufacturing process for the micro-device panel as recited in claim 1, wherein the at least one micro-device of each of the building blocks forms a micro-device array, a number of rows of the micro-device array is M, a number of columns of the micro-device array is N, and M and N are positive integers.

8. The manufacturing process for the micro-device panel as recited in claim 7, wherein each of the connecting devices comprises a plurality of first connecting lines in a first direction and a plurality of second connecting lines in a second direction, a number of the first connecting lines is X, a number of the second connecting lines is Y, and X and Y are positive integers.

9. The manufacturing process for the micro-device panel as recited in claim 8, wherein X is greater than or equal to M, and Y is greater than or equal to N.

10. The manufacturing process for the micro-device panel as recited in claim 8, wherein the first connecting lines and the second connecting lines are made by a photolithography process.

* * * * *